United States Patent [19]
Kaltenbrunner et al.

[11] Patent Number: 5,837,555
[45] Date of Patent: Nov. 17, 1998

[54] APPARATUS AND METHOD FOR RAPID THERMAL PROCESSING

[75] Inventors: Guenter Kaltenbrunner, Baldham; Zsolt Nenyei, Blaustein; Helmut Sommer, Deggingen, all of Germany

[73] Assignee: AST Electronik, Kirchheim, Germany

[21] Appl. No.: 631,265

[22] Filed: Apr. 12, 1996

[51] Int. Cl.[6] .................. H01L 21/324; H01L 21/477; C23C 16/00; A21B 2/00
[52] U.S. Cl. .................. 437/248; 118/724; 219/390; 392/416; 392/418; 432/253
[58] Field of Search .............. 437/8, 247, 248; 118/715, 724, 725, 728, 729, 730, 731, 732; 219/390, 405, 411; 356/43, 44; 374/121, 126, 128; 392/416, 418; 432/253, 254.1

[56] References Cited

U.S. PATENT DOCUMENTS

| | | | |
|---|---|---|---|
| 3,713,900 | 1/1973 | Suzuki | 118/725 |
| 4,312,681 | 1/1982 | Rupprecht et al. | 437/247 |
| 4,365,588 | 12/1982 | Jolly | 118/732 |
| 4,794,217 | 12/1988 | Quan et al. | 437/247 |
| 4,978,567 | 12/1990 | Miller | 437/247 |
| 5,011,794 | 4/1991 | Grim et al. | 437/247 |
| 5,308,161 | 5/1994 | Stein | 392/416 |

OTHER PUBLICATIONS

Goff et al, "Elimination of slip lines in capless RTA of GaAs", J. Mat. Res. 3, 911–913 (1988).

Pearton et al, "High temperature degradation free RTA of GaAs and InP", SPIE 1393, 150–160, (1990).

*Primary Examiner*—Brian Dutton
*Attorney, Agent, or Firm*—R. T. Hodgson

[57] ABSTRACT

A closable enclosure for rapid thermal processing of semiconductor wafers is presented, wherein the closable enclosure has an enclosed volume less than 10 times the volume of the wafer, and wherein the closable enclosure may closed about the wafer while the closable enclosure is surrounded by the process gas.

22 Claims, 4 Drawing Sheets

APPARATUS AND METHOD FOR RAPID THERMAL PROCESSING

BACKGROUND OF THE INVENTION

1. Field of the Invention

The present invention relates to a method and an apparatus for the rapid thermal processing (RTP) of sensitive electronic materials. The present invention allows high throughput of wafers which must be rapidly processed inside a small enclosure to reduce the loss of material from the wafer surface.

2. Description of the Prior Art

Rapid Thermal Processing (RTP) is a versatile optical heating method which can be used for semiconductor processing as well as a general, well controlled, method for heating objects or wafers which are in the form of thin sheets, slabs, or disks. The objects are generally inserted into a chamber which has at least some portions of the chamber walls transparent to transmit radiation from powerful heating lamps. The transparent portion of the walls is generally quartz, which will transmit radiation up to a wavelength of 3 to 4 microns. These lamps are generally tungsten-halogen lamps, but arc lamps or any other source of visible and/or near infra-red radiation may be used The radiation from the lamps is directed through the transparent portions of the walls on to the surface of the object to be heated. As long as the objects absorb light in the near infrared or visible spectral region transmitted by the transparent portion of the walls, RTP techniques allow fast changes in the temperature and process gas for the different material processes and conditions. RTP allows the "thermal budgets" of the various semiconductor processing to be reduced, as well as allows the production of various metastable states which can be "frozen in" when the material is cooled rapidly.

RTP systems are relatively new. In the last 10 or 15 years, such systems were used only in research and development. The thrust of the work was increasing the temperature uniformity, and developing heating cycles and processes which decreased the thermal budget. Prior art RTP machines can heat unstructured, homogeneous materials in the form of a flat plate or disk, and produce temperature uniformities across the plate adequate for semiconductor processing processes.

The temperature control in current RTP systems is mostly performed by monochromatic (or narrow wavelength band) pyrometry measuring temperature of the relatively unstructured and featureless backside of semiconductor wafers. The results of the temperature measurement are generally used in a feedback control to control the heating lamp power. Backside coated wafers with varying emissivity can not be used in this way, however, and the backside layers are normally etched away or the temperature is measured using contact thermocouples.

A newer method of temperature control is the power controlled open loop heating described in U.S. Pat. No. 5,359,693, which patent is hereby incorporated by reference.

German patent DE42 23 133 C2, hereby incorporated by reference, discloses a method of producing relatively defect free material in RTP machines. Apparatus induced thermal inhomogeneities have been reduced in the last few years because of the demand for more uniform processing. Among the techniques used have been control of the individual lamp power, use of circular lamps, and rotation of the semiconductor wafers with independent power control.

Most RTP machines have a thin rectangular quartz reaction chamber having one end open. Chambers meant for vacuum use often have a flattened oval cross section. Chambers could even be made in the form of a flat cylindrical pancake. In general, the chambers are used so that the thin objects to be heated are held horizontally, but they could also be held vertical or in any convenient orientation. The reactor chamber is usually thin to bring the lamps close to the object to be heated. The reactor chamber is opened and closed at one end with a pneumatically operated door when the wafer handling system is in operation. The door is usually made of stainless steel, and may have a quartz plate attached to the inside. The process gas is introduced into the chamber on the side opposite the door and exhausted on the door side. The process gas flow is controlled by computer controlled valves connected to various manifolds in a manner well known in the art.

Reactors based on this principle often have the entire cross section of one end of the reactor chamber open during the wafer handling process. This construction has been established because the various wafer holders, guard rings, and gas distribution plates, which have significantly greater dimensions and may be thicker than the wafers, must also be introduced into the chamber and must be easily and quickly changed when the process is changed or when different wafer sizes, for example, are used. The reaction chamber dimensions are designed with these ancillary pieces in mind. Copending patent application Ser. No. 08/387,220 now U.S. Pat. No. 5,580,830, assigned to the assignee of the present invention, hereby incorporated by reference, teaches the importance of the gas flow and the use of an aperture in the door to regulate gas flow and control impurities in the process chamber.

The wafer to be heated in a conventional RTP system typically rests on a plurality of quartz pins which hold the wafer accurately parallel to the reflector walls of the system. Prior art systems have rested the wafer on an instrumented susceptor, typically a uniform silicon wafer. Copending patent application Ser. No. 08/537,409, assigned to the assignee of the present invention, hereby incorporated by reference, teaches the importance susceptor plates separated from the wafer.

Rapid thermal processing of II–VI and III–IV compound semiconductors has not been as successful as RTP of silicon. One reason for this is that the surface has a relatively high vapor pressure of for example, arsenic (As) in the case of gallium arsenide (GaAs). The surface region becomes depleted of As, and the material quality suffers.

Kanack et. al., Appl. Phys. Lett. 55, 2325, (1989) disclose a method of annealing contacts in GaInAsP by placing the InP substrate wafer between two silicon susceptor wafers.

Katz et. al., J. of Vac. Science and Tech. B 8, 1285, (1990); Pearton et. al. in SPIE 1393, 150, (1991), and Kazior et. al. IEEE transactions on Semiconductor Manufacturing 4, 21 (1991) teach a method of enclosing a compound semiconductor wafer in an enclosed susceptor having an enclosed volume only slightly greater than the wafer volume, then placing the susceptor in the RTP system for processing. A sacrificial wafer is processed first to charge the walls of the interior of the enclosed susceptor with the volatile component of the wafer of interest, and thereafter a number of product wafers can be treated. Presumably, the partial pressure of the volatile component inside the susceptor is high enough that the rate of evaporation from the wafer surface is equal to the rate at which the volatile component redeposits on the wafer surface.

Such a process does not lead to high throughput, however. The wafer and the enclosing susceptor must be flushed for a relatively long time to expel all the oxygen which was introduced into the enclosure when the wafer was introduced.

The enclosed susceptor could be flushed relatively rapidly if the vacuum RTP system is used. However, these systems have much greater cost and complexity.

OBJECTS OF THE INVENTION

It is an object of the invention to provide an improved rapid thermal processing (RTP) apparatus, method and system which increases the throughput of objects which must be processed in a small volume enclosure.

It is an object of the invention to provide a method of heating an object in a RTP system so that temperature inhomogeneities due to differences in material or absorption coefficient or emission coefficient are reduced.

It is an object of the invention to provide a rapid thermal processing system which is capable of rapid turnaround of semiconductor wafers and high throughput of processed wafers with good repeatability even in the case where backside emissivity of the wafers varies.

SUMMARY OF THE INVENTION

The object to be processed is placed into a closable enclosure having a very small enclosed volume. The interior of the closable enclosure is filled with a process gas. When the object to be processed is surrounded by the process gas, the closable enclosure is closed, and the closed enclosure with the enclosed object is then processed in an RTP system

DETAILED DESCRIPTION OF THE INVENTION

Figure 1:
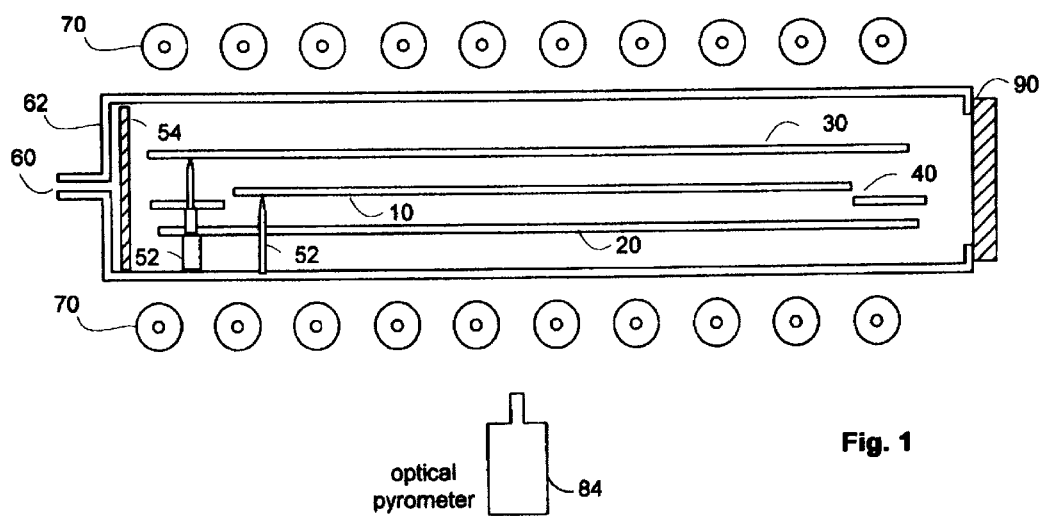
FIG. 1 is a sketch of an open ended quartz reactor chamber RTP system with two banks of heating lamps.

FIG. 1 shows a wafer 10 held in an RTP apparatus. A guard ring 40 is shown. Susceptor plates 20 and 30 are shown. The wafer 10, the susceptor plates 20 and 30, and the guard ring 40 are all supported by quartz pins 52. The gas inlet 60 to the quartz chamber 62 releases process gas which is baffled by baffle plates 54. Heating lamps 70 supply the radiation for heating wafer. A pyrometer 84 measures the temperature of the susceptor plate 20. A door 90 seals the quartz chamber 62.

Figure 2B:
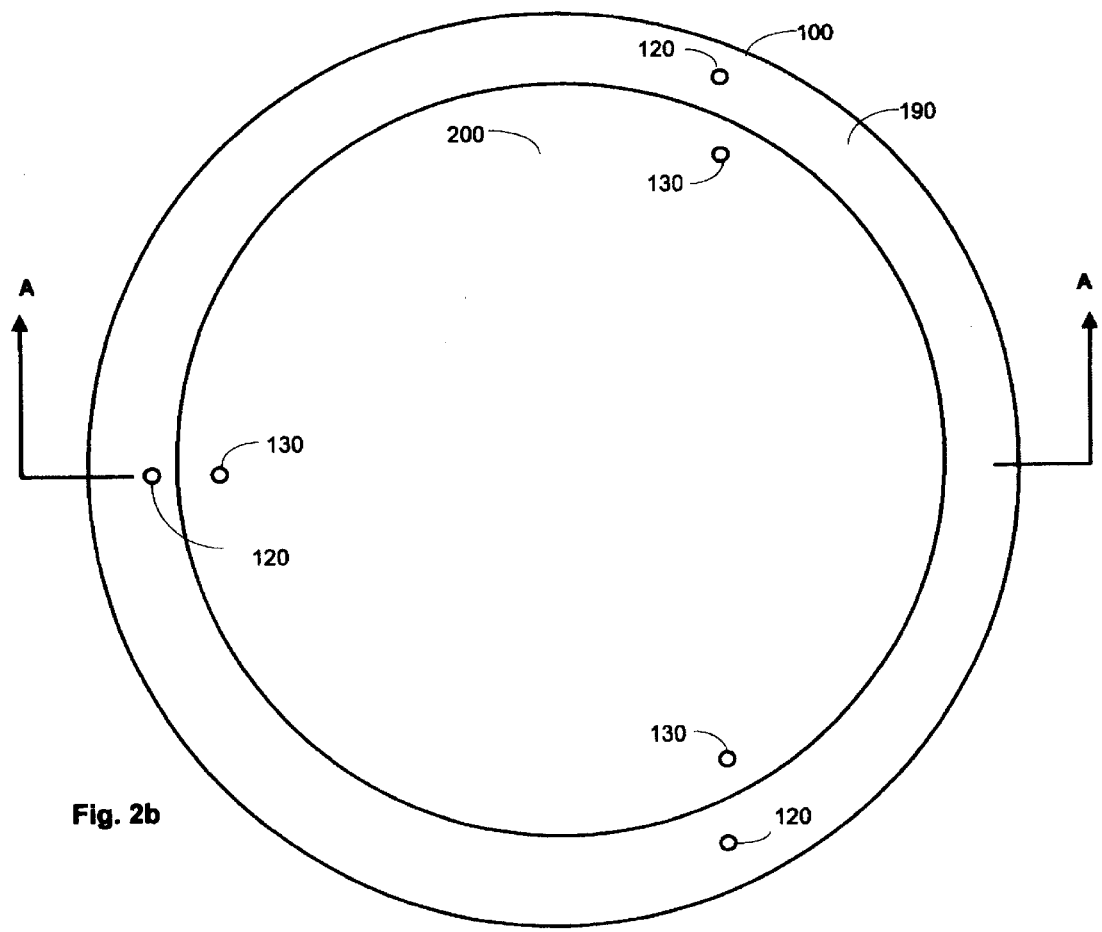
FIGS. 2a–2b are sketches of the most preferred embodiment of the enclosure of the invention.
Figure 2A:
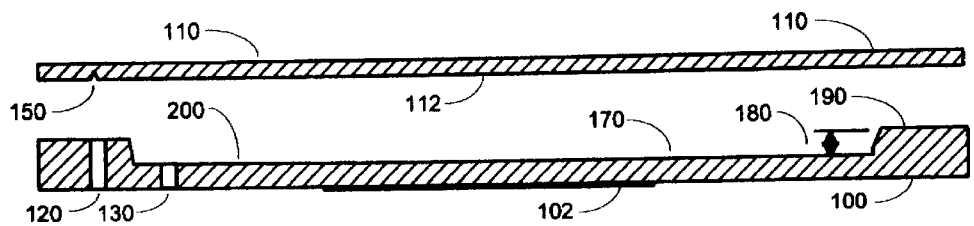

FIGS. 2a–b shows a sketch of a closable enclosure which can be closed in the process gas of an RTP system. FIGS. 2a–b gives a sketch of the most preferred embodiment of the invention. A base 100 and a lid 110 are shown in elevation in FIG. 2a. When the closable enclosure is closed, the lid 110 sits on the upper surface 190 of the base. A semiconductor wafer (shown later) to be heated sits on the surface 170 of the base 100. The thickness of the semiconductor wafer is slightly less than the depth 180 of the well 200 in the base 100. The diameter of the semiconductor wafer is slightly less than the diameter of the well 200. The volume of the semiconductor wafer is less than the enclosed volume formed by the well 200 and the lid 110 when the lid 110 is resting on the surface 190 of the base 100. The well 100 could equivalently be in the lid 110, or there could equivalently be a well in both the base 100 and the lid 110. Since a small amount of the volatile component of the wafer coats the walls of the interior of the enclosure, and this volatile component is driven off when the wafer is processed, the interior volume of the closable enclosure must be as small as possible to give the largest vapor pressure of the volatile component. The enclosed volume of the closable container should be less than about 10 times the volume of the enclosed wafer, more preferably less than 2 times the volume of the enclosed wafer, and most preferably less than 1.5 times the volume of the enclosed wafer. A plurality of holes 120 are located around the periphery of the base 100 to allow at least 3 quartz pins (shown later) to slidably pass through the base 100 to support the lid 110 above the base 100. A further plurality of holes 130 in the base 100 allow at least 3 quartz pins (shown later) to slidably pass through the base 100 to support a wafer (shown later) above the base 100 and below the lid 110. An optional detent 150 ensures that the quartz pins (shown later) hold the lid 110 in a repeatable position with respect to the base 100. An optional detent 160 (shown later) allows the base 100 to be held in a repeatable position with respect to quartz pins (shown later). An optional film 102 to control the reflectivity of a portion of the exterior surface of the closable enclosure is shown covering a portion of the bottom of the base 100. The optional film 102 may be placed in any convenient place on the exterior surface of the base or the lid depending on the convenience of viewing the film 102 with a pyrometer. The optional film may cover the entire surface of the closable enclosure, or just a very small part of the surface which is in the field of view of an optical temperature measuring instrument. The lower surface 112 of the lid 110 and the surface 170 may be specially treated to control contamination of the surfaces 112 and 170. FIG. 2b shows a plan view of base 100 where A–A' denotes the section taken for FIG. 2a.

Figure 3A:
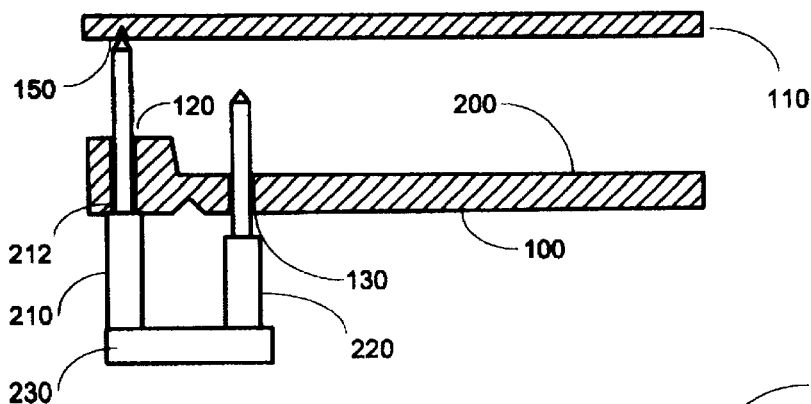
FIGS. 3a–f are sketches of operational steps of a preferred method of using the apparatus of the most preferred embodiment of the invention.
Figure 3B:
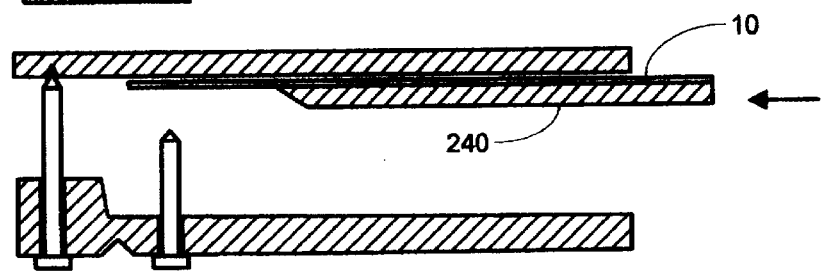
Figure 3C:
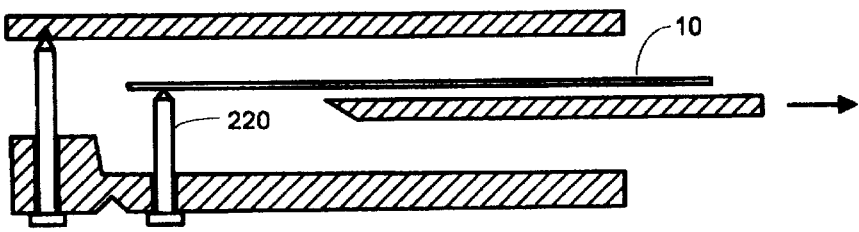
Figure 3D:
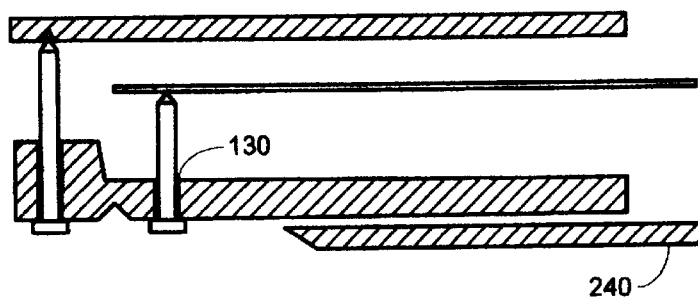
Figure 3E:
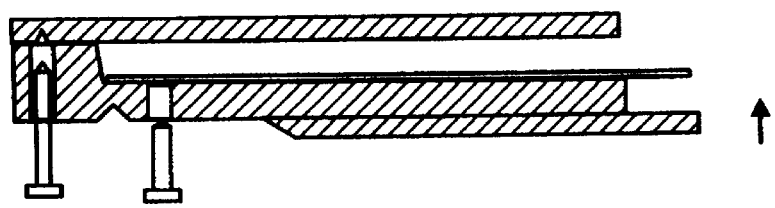
Figure 3F:
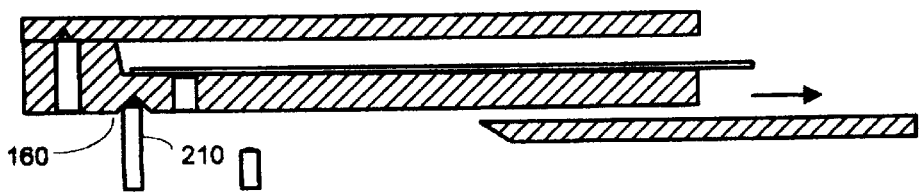

FIG. 3a–f shows a sketch of the operational steps of loading wafers into the apparatus of FIGS. 2a–b in a preferred method of the invention. The apparatus of FIG. 2 is preferably located inside the reaction chamber of a rapid thermal processing system in an atmosphere of process gas. The process gas can be an inert gas such as helium, neon, or argon, or it may be a gas such as nitrogen or a forming gas such as nitrogen admixed with hydrogen or argon admixed with hydrogen. The process gas is not critical to the invention, as long as it contains very little admixture of gas which would be injurious to the RTP processing of the wafer. The chamber of the RTP system is flushed with a laminar flow of flushing or process gas in a preferred embodiment of the invention, and little outside atmosphere penetrates the reaction chamber. FIG. 3a shows the lid 110 and the base 100 of the enclosure supported by a plurality of at least 3 quartz pins 210 (one pin shown) which pass through the holes 120 in the base 100. The base 100 is shown resting on a shoulder 212 of pin 210. The end of pin 210 rests in the optional detent 150 of the lid 110. A plurality of at least 3 quartz pins 220 (one pin shown) also pass through a plurality of holes 130 in the base. The quartz pins are free to slide through the holes 120 and 130 in the base 100. The holes 120 may be located equidistant from the center of the base 100, and the holes 130 may be located equidistant from the center of the base 100 at a smaller radius than the holes 120. The number and placement of the holes 130 and 120 is not critical to the invention. The holes 120 must be placed so that the plurality of pins 210 support the base 100 and the lid 110, and so that a wafer may pass between the quartz pins 210 and below the lid 110 to be located above the center of the base 100. The number and placement of the holes 130 is not critical to the invention. At least 3 holes 120 and pins 210 are necessary to support the base 100 and the lid 110. The pins 220 must be close enough together to support a wafer as shown later. The quartz pins 210 and 220 are supported on a mounting plate 230. FIG. 3b shows a robot pan 240 carrying a wafer 10 entering the space between the base 100 and the lid 110 of FIG. 1a. FIG. 3c shows that the robot pan 240 has lowered the wafer 10 so that the wafer 10 sits on the quartz pins 220. The robot pan 240 is withdrawing from the space between the lid 110 and the base 100. FIG. 3d shows the robot pan reentering under the base 100. FIG. 3e shows the robot pan 240 raising until it contacts the base 100 and lifts the base 100 from the mounting pins 210. The base 100 lifts the wafer 10 from the pins 220. The base 100 lifts the lid 110 from the pins 210. FIG. 3f shows that the robot pan 240 has lifted the base 100 free of the pins 210, (thereby closing the closable enclosure), moved the base 100, the wafer 10, and the lid 110 a short distance horizontally until the detent 160 in base 100 is above the pin 210, and lowered the base 100 until the base 100 rests on the end of pin 210. FIG. 3f shows the robot pan 240 withdrawing. After the robot pan 240 has withdrawn, the door to the RTP chamber is closed, and the wafer 10 within the closed enclosure formed by base 100 and lid 110 is ready for rapid thermal processing.

Figure 4:
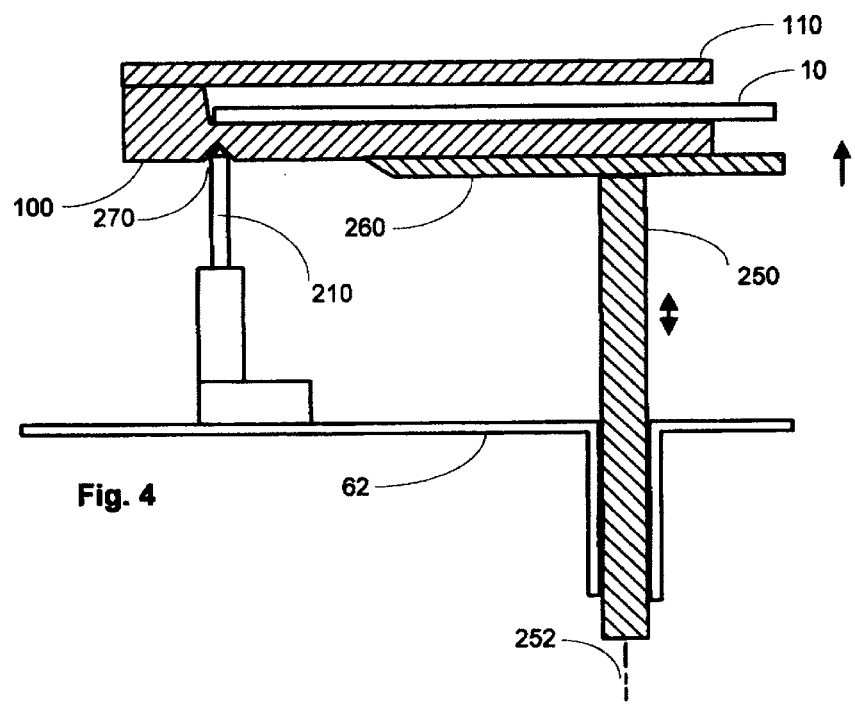
FIG. 4 is a sketch of a preferred apparatus for practicing the method of the invention.

A preferred embodiment of the invention is shown in FIG. 4. The first steps of the method of the invention are identical to the steps of FIG. 3a–c. The steps of lining the base and lid of the apparatus of the invention are carried out by an elevator mechanism 250 that passes through the walls of the RTP chamber 62. FIG. 4 shows a pan 260 connected to the elevator 250. The pan 260 has lifted the base 100, the wafer 10 and lid 110 away from the supporting pins. In this position, the elevator mechanism 250 has been rotated around its axis 252 to bring further detents 270 above the quartz pins 210.

The detents 270 are at the same radius as the holes 120 with respect to the elevator 250. FIG. 4 shows the base 100 lowered so that it rests on the pins 210. The elevator pan 260 can now be withdrawn so that the closable enclosure and the wafer are now ready for RTP. This preferred embodiment of the invention is preferred in the case that the process gas inside the closable enclosure be as clean as possible. The RTP chamber door may be closed after the step represented by FIG. 3c, and the process chamber flushed until there is sufficiently little impurity in the process gas surrounding the wafer 10. At this point, the closable enclosure is closed, and the process continued.

Figure 5A:
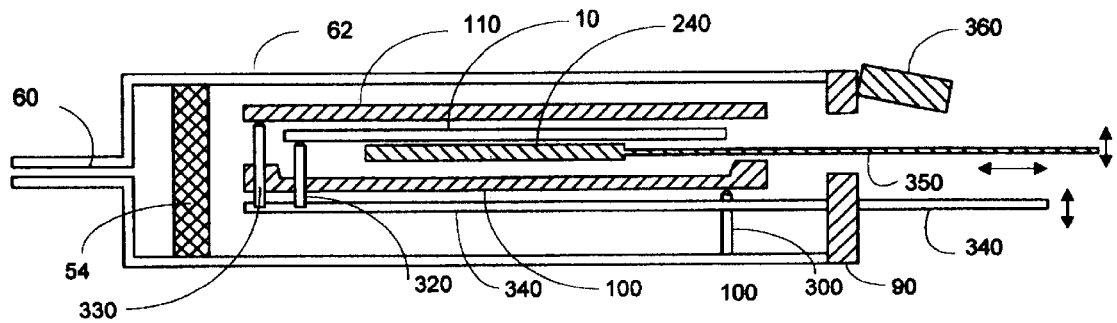
FIGS. 5a–b are sketches of operational steps of the most preferred method of using the apparatus of a the most preferred embodiment of the invention.
Figure 5B:
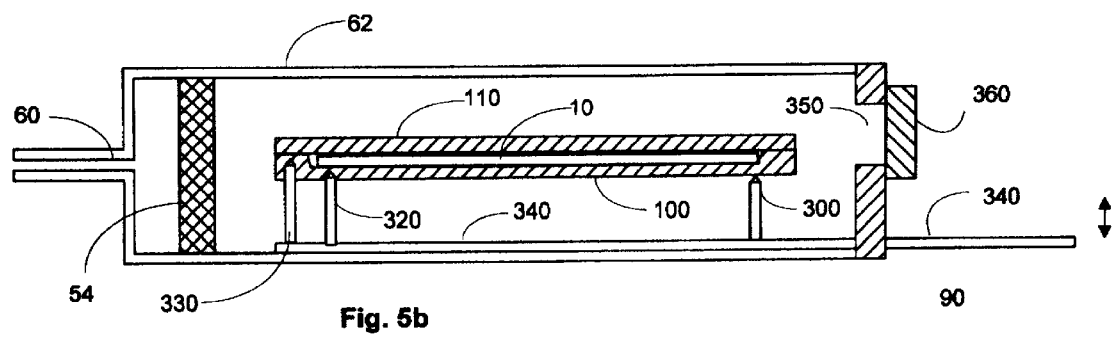
Figure 6:
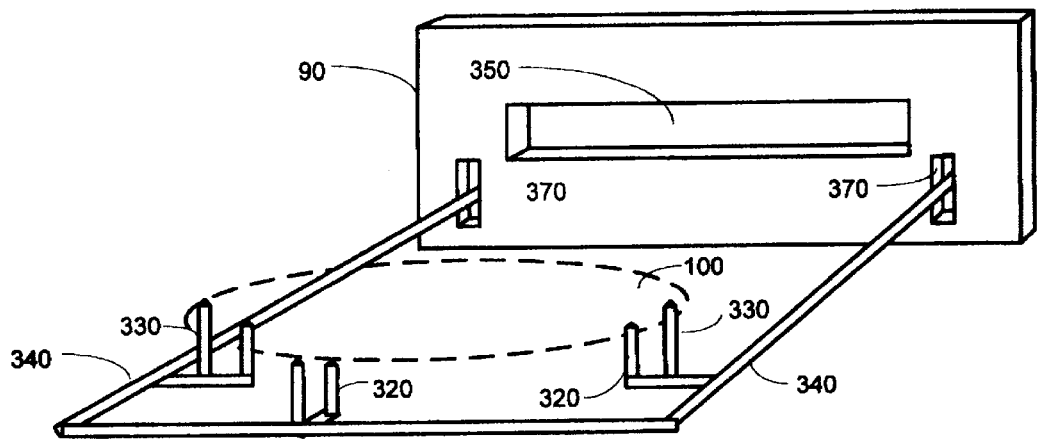
FIG. 6 is a sketch of the support frame for apparatus of FIG. 5.

The most preferred method of closing the closable enclosure when the door of the reactor chamber is closed is shown in FIG. 5a–b. In this figure, the base 100 is supported by a plurality of quartz pins 300 and does not move, and the lid 110 and the wafer 10 are lifted free of the base 100 by quartz pins 330 and 320 respectively. The quartz pins 330 and 320 are fastened to a quartz carrier frame 340, which may be raised and lowered by an elevator mechanism through the wall of the RTP chamber as sketched in FIG. 4, or more preferably are raised and lowered by extensions of The carrier frame 340 passing through the door 90 of the RTP chamber as sketched in FIG. 5a and 5b. The door 90 has an aperture 350 to control the flow of process gas, and the aperture 350 is closed by a door 360. The frame 340 passes through slots (shown later) cut in the door 90. FIG. 5a shows the system after the wafer 10 has been brought into the space between the base 100 and the lid 110 when the robot pan 240 has been lowered and is withdrawing. FIG. 5a shows the system after the system has been flushed, the carrier frame 340 has lowered the wafer 10 and the lid 110 into contact with the base 100, and the system is ready for RTP FIG. 6 shows a sketch of a simple carrier frame 340 arrangement for supporting the pins 320 and 330, (with the position of the base 100 indicated by a dotted line) and for passing the frame 340 through slots 370 in door 90 of the chamber. The aperture 350 need only be wide enough to admit the wafer 10, and high enough to provide clearance on the top for the wafer entering the RTP chamber, and low enough to provide clearance for the robot pan 240 to withdraw after the robot pan 240 has deposited the wafer 10 on the pins 320. The slots 370 allow the frame 340 to be raised and lowered, and may be sealed by methods known in the art to prevent all or most leakage of outside atmosphere into the reaction chamber. Typical sealing methods use bellows to effect a gas tight seal, or a sliding plate to reduce process gas flushing flow to a very small amount. The frame 340 may be equivalently swivelled at the position of the slots 370 in order to raise and lower the pins 330 and 320.

The invention is not limited to loading the wafer into the enclosable enclosure located inside the chamber of a conventional RTP processing system. It is an embodiment of the invention that the wafer can be placed inside the closable enclosure anywhere, as long as the closable enclosure is surrounded with a process gas or a suitably clean environment such as a vacuum or low pressure gas environment when the closable enclosure is closed. The steps 3a–e may be carried out in such an environment and the robot pan 240 used to transport the closed enclosure into the chamber of the RTP system for further steps. As long as the closable enclosure remains in a clean process gas, or as long as little contaminating atmosphere leaks into the closable enclosure, the method of the invention may be practiced. It is a further embodiment of the invention that the RTP system need not have the conventional reaction chamber in such a situation. As long as the closable enclosure retains the process gas or the closable enclosure remains surrounded by process gas, the radiation from the radiation source may be used to heat the enclosed object without passing through an intervening transparent window.

The techniques and controllers for controlling the radiation source and for controlling the process gas are well known in the art. The wafer handling systems for translating, picking up, and putting down wafers are also very well known in the art of RTP. The invention is not limited to the particular methods of controlling process gas, radiation sources, and material handling cited above.

The closable enclosure can be made of any material which prevents the escape of the volatile component of the wafer material. Transparent materials such as quartz pass the heating radiation from the lamps directly to the wafer. The preferred embodiment is a "hot box" enclosure which absorbs and is heated by the visible and/or near infra-red radiation from the heating lamps. The object to be processed is then heated by conduction and/or convection and/or radiation of heat from the walls of the closable enclosure. Materials such as heavily doped silicon, silicon carbide, boron nitride, graphite, silicon carbide coated graphite, diamond coated graphite, or other such materials are suitable. The invention is not limited to the choice of materials of the enclosure.

The interior of the closable enclosure is optionally comprised of a porous or etched material which may retain more of the volatile component of the wafer per unit area than a dense material. Suitable materials are porous tungsten, porous silicon or silicon with pore diameter in the range of 0.1 to 10 microns. A material which has surface relief features which increase the effective surface area or specific area is also be used to good effect. Such materials as etched polysilicon have effective surface areas greater than 1.5. Anisotropically etched <11O> silicon have effective surface areas greater than 10. Such surfaces are of value when long runs of processing must be carried out without recharging the surface with the volatile material, and when the surface does not have contact with contaminating gas when the processed wafer is withdrawn and a new wafer is inserted. In the case that the closable enclosure is exposed to a contaminating atmosphere, it is more preferable to have an effective surface or specific area of the interior of the closable enclosure which is as small as possible. In this case, highly polished material which is very smooth is preferable. Such surfaces are provided by polished graphite coated with titanium carbide, for example. The surface roughness of the surface should be less than 1 micron, more preferably less than 0.1 microns, and most preferably less than 0.025 microns over a substantial portion of the interior surface of the closable enclosure.

Use of the closable enclosure solves a temperature control problem when back side pyrometry is used to measure and control the wafer temperature where a backside film on the wafer may change the emissivity of the wafer and interfere with the temperature measurement and control. The exterior walls of the closable enclosure presumably will have constant emissivity and reflectivity from wafer to wafer, and the temperature of the wafer can be inferred from the measured temperature of a wall of the closable enclosure. Use of a pyrometer which measures a narrow band width of wavelengths is also made easier, because the closable enclosure may reflect less scattered lamp light to the pyrometer than a semiconductor surface. For example, a bare silicon surface reflects 32% of the visible light incident on the surface. This reflection may markedly vary as the silicon has various thin film coatings, and may markedly vary as the thickness of the coating varies. The reflectivity for visible and near IR light of the surfaces of the closable enclosure should be preferably less than 32%, more preferably less than 25%, and even more preferably less than 10%.

It is a further embodiment of the invention to control the reflectivity and emissivity of the closable enclosure by coating an outside surface of the enclosure with one or more layers of a thin film 102. A single thin film thickness is conveniently set so that the reflectivity of the closable enclosure has a minimum of less than 3% at the wavelength which the pyrometer measures. A multilayer film is used for a pyrometer or a pyrometer plus filter combination which measures a very narrow bandwidth of infra-red radiation, so that the reflection coefficient is less than 1% at the wavelength region which the pyrometer measures. In this manner, the light reflected from the surface gives less background in the pyrometer measurement.

It is a further embodiment of the invention to coat an exterior surface of the enclosure with a material that has a very high emissivity and low reflectivity at the wavelength measured by the pyrometer. Such a coating as known in the art of absorbing coatings is formed by dendritic tungsten.

The absorption coefficient of the material of the closable enclosure for radiation should preferably high enough that the closable enclosure transmits less than 5% of the visible and/or the near IR radiation light incident on to its surfaces. The closable enclosure is most preferably opaque to visible and/or to near infra-red light from the heating lamps.

It is an additional embodiment of the invention to increase throughput by holding the temperature of the closable enclosure at an elevated temperature while the already processed wafer is removed and a new wafer to be processed is introduced. The lamps are run at lower power to keep the temperature of the closable enclosure at minimum temperature while the wafer is being changed.

It is an additional embodiment of the invention to control contamination of the surfaces of the closable enclosure by heating the closable enclosure and the wafer before the closeable enclosure is closed. In this way, the contaminant gases adsorbed on the wafer and on the interior surfaces of the closable enclosure may be driven off and flushed away by the process gas. The enclosure and the wafer should be heated to a temperature sufficient to drive off adsorbed contaminant gases, but not high enough to drive off the adsorbed component of the semiconductor wafer which is to be processed. The preferred temperature is greater than 100° C., a more preferred temperature is 200° C., an even more preferred temperature is greater than 300° C., and the most preferred temperature is greater than 400° C.

We claim:

1. A method for Rapid Thermal Processing (RTP) of an object, the object having an object volume, in an RTP system comprising a radiation source and a closable enclosure having an enclosed volume less than 10 times greater than the object volume, comprising;

a) placing the object in the closable enclosure;

b) surrounding the object with a process gas;

c) after the step of surrounding the object, then closing the closable enclosure; and d) after the step of closing the closable enclosure, then processing the object with radiation from the radiation source.

2. The method of claim 1, wherein the closable enclosure has a volume less than twice the object volume.

3. The method of claim 1, wherein the closeable enclosure has a volume less than 1.5 times the object volume.

4. The method of claim 1, further comprising the additional step e) measuring the temperature of the closable enclosure.

5. The method of claim 4, wherein said temperature of the closable enclosure is measured with a pyrometer, the pyrometer measuring radiation within a particular bandwidth range.

6. The method of claim 5, wherein a portion of the exterior surface of the closable enclosure has a reflectivity of less than 10% at the particular bandwidth range measured by the pyrometer.

7. The method of claim 6, wherein a portion of the exterior surface of the closable enclosure has a reflectivity of less than 3% at the particular bandwidth range measured by the pyrometer.

8. The method of claim 7, wherein a portion of the exterior surface of the closable enclosure has a reflectivity of less than 1% at the particular bandwidth range measured by the pyrometer.

9. The method of claim 1, wherein a portion of the interior surface of the closable enclosure has a specific surface area greater than 1.5.

10. The method of claim 9, wherein the specific surface area is greater than 10.

11. The method of claim 1, wherein a substantial portion of the interior surface of the closeable enclosure has a surface smoothness less than 1 micron.

12. A method for Rapid Thermal Processing (RTP) of an object in an RTP system comprising a radiation source and a first closeable enclosure, the first closable enclosure having at least a portion of at least one wall able to transmit radiation from the radiation source, comprising;
   a) placing the object in a second closable enclosure, the second closable enclosure located inside the first closeable enclosure;
   b) flushing the first closable enclosure with a flushing gas;
   c) after the step of flushing; then closing the second closable enclosure to enclose the object; and
   d) after the step of closing the second closable enclosure, then closing the first closable enclosure to enclose the second closable enclosure and the object;
   e) after the step of closing the first closable enclosure, then processing the object by transmitting said radiation from the radiation source through the at least one wall of the first closable enclosure to heat the object.

13. The method of claim 12, wherein step (d) is carried out between step (b) and step (c).

14. The method of claim 12, further comprising heating the second closable enclosure during step (b).

15. The method of claim 13, further comprising heating the second closable enclosure during step (b).

16. The method of claim 12, further comprising the additional step of measuring the temperature of the second closable enclosure during step (e).

17. A method for Rapid Thermal Processing (RTP) of an object, the object having an object volume, in an RTP system comprising a radiation source and a closable enclosure having an enclosed volume less than 10 times greater than the object volume, comprising:
   a) placing the object in the closable enclosure;
   b) surrounding the object with a process gas;
   c) closing the closable enclosure;
   d) processing the object with radiation from the radiation source; and
   e) measuring the temperature of the closable enclosure with a pyrometer, the pyrometer measuring radiation within a particular bandwidth range, wherein a portion of the exterior surface of the closable enclosure has a reflectivity of less than 10% at the particular bandwidth range measured by the pyrometer.

18. The method of claim 17 wherein a portion of the exterior surface of the closable enclosure has a reflectivity of less than 3% at the particular bandwidth range measured by the pyrometer.

19. The method of claim 18 wherein a portion of the exterior surface of the closable enclosure has a reflectivity of less than 1% at the particular bandwidth range measured by the pyrometer.

20. A method for Rapid Thermal Processing (RTP) of an object, the object having an object volume, in an RTP system comprising a radiation source and a closable enclosure having an enclosed volume less than 10 times greater than the object volume, comprising;
   a) placing the object in the closable enclosure, wherein a portion of the interior surface of the closable enclosure has a specific surface area greater than 1.5;
   b) surrounding the object with a process gas;
   c) closing the closable enclosure; and
   d) processing the object with radiation from the radiation source.

21. The method of claim 20 wherein the specific surface area is greater than 10.

22. A method for Rapid Thermal Processing (RTP) of an object, the object having an object volume, in an RTP system comprising a radiation source and a closable enclosure having an enclosed volume less than 10 times greater than the object volume, comprising;
   a) placing the object in the closable enclosure, wherein a substantial portion of the interior surface of the closable enclosure has a surface smoothness less than 1 micron:
   b) surrounding the object with a process gas;
   c) closing the closable enclosure;
   d) processing the object with radiation from the radiation source.

* * * * *